(12) United States Patent
Lee et al.

(10) Patent No.: US 8,664,655 B2
(45) Date of Patent: Mar. 4, 2014

(54) ORGANIC LIGHT EMITTING DISPLAY APPARATUS

(75) Inventors: Sung-Hun Lee, Yongin (KR); Gun-Shik Kim, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 455 days.

(21) Appl. No.: 13/023,094

(22) Filed: Feb. 8, 2011

(65) Prior Publication Data
US 2011/0198629 A1    Aug. 18, 2011

(30) Foreign Application Priority Data
Feb. 12, 2010    (KR) ........................ 10-2010-0013506

(51) Int. Cl.
*H01L 29/10*    (2006.01)
(52) U.S. Cl.
USPC ............................................ 257/45; 313/498
(58) Field of Classification Search
USPC ............................................ 257/45; 313/498
See application file for complete search history.

(56) References Cited

U.S. PATENT DOCUMENTS

| | | | |
|---|---|---|---|
| 6,903,378 B2 | 6/2005 | Cok | |
| 7,586,497 B2 | 9/2009 | Boroson et al. | |
| 8,087,964 B2 * | 1/2012 | Yang et al. | 445/24 |
| 2007/0123135 A1 * | 5/2007 | Yang et al. | 445/24 |
| 2008/0007492 A1 | 1/2008 | Koh et al. | |
| 2008/0122348 A1 | 5/2008 | Jeong et al. | |
| 2009/0096358 A1 | 4/2009 | Lee et al. | |
| 2009/0096359 A1 | 4/2009 | Lee et al. | |
| 2009/0102362 A1 | 4/2009 | Lee et al. | |
| 2009/0115706 A1 | 5/2009 | Hwang et al. | |
| 2009/0200544 A1 | 8/2009 | Lee et al. | |
| 2009/0200921 A1 | 8/2009 | Lee et al. | |
| 2009/0200922 A1 | 8/2009 | Lee et al. | |
| 2009/0206733 A1 | 8/2009 | Hwang et al. | |
| 2009/0251048 A1 | 10/2009 | Choi et al. | |
| 2009/0251051 A1 | 10/2009 | Hwang et al. | |
| 2009/0261716 A1 | 10/2009 | Choi et al. | |
| 2009/0262270 A1 | 10/2009 | Kim et al. | |

(Continued)

FOREIGN PATENT DOCUMENTS

| | | |
|---|---|---|
| KR | 10-0796603 B1 | 1/2008 |
| KR | 10-2008-0058538 A | 6/2008 |

(Continued)

OTHER PUBLICATIONS

Korean Notice of Allowance issued on Dec. 27, 2011 in connection with Korean Patent Application Serial No. 10-2010-0013506 and Request for Entry of the Accompanying Office Action attached herewith.

(Continued)

*Primary Examiner* — Howard Weiss
*Assistant Examiner* — Steven Rao
(74) *Attorney, Agent, or Firm* — Robert E. Bushnell, Esq.

(57) ABSTRACT

An organic light emitting display apparatus has a hybrid structure in which resonance red, green and blue pixels and a non-resonance white pixel are combined. An optical path control layer and a white color filter which selectively absorbs light having a specific wavelength are included in the white pixel. Thus, the organic light emitting display apparatus has a large viewing angle, low power consumption, and long lifetime.

19 Claims, 6 Drawing Sheets

(56) References Cited

U.S. PATENT DOCUMENTS

2009/0267494 A1    10/2009  Lee et al.
2010/0066242 A1    3/2010   Lee et al.
2010/0133994 A1    6/2010   Song et al.

FOREIGN PATENT DOCUMENTS

| KR | 10-2009-0037274 A | 4/2009 |
| KR | 10-2009-0038637 A | 4/2009 |
| KR | 1020090039065     | 4/2009 |
| KR | 10-2009-0054299 A | 5/2009 |
| KR | 1020090106099     | 10/2009 |
| KR | 1020090112090     | 10/2009 |

OTHER PUBLICATIONS

Korean Office Action issued by Korean Patent Office on Apr. 18, 2011, corresponding to Korean Patent Application No. 10-2010-0013506 and Request for Entry of the Accompanying Office Action attached herewith.

* cited by examiner

ORGANIC LIGHT EMITTING DISPLAY APPARATUS

CLAIM OF PRIORITY

This application makes reference to, incorporates the same herein, and claims all benefits accruing under 35 U.S.C. §119 from an application earlier filed in the Korean Intellectual Property Office on the 12 Feb. 2010 and there duly assigned Serial No. 10-2010-0013506.

BACKGROUND OF THE INVENTION

1. Field of the Invention

The present invention relates to an organic light emitting display apparatus and, more particularly, to an organic light emitting display apparatus having a hybrid structure in which a resonance pixel and a non-resonance pixel are combined with each other.

2. Description of the Related Art

Generally, an organic light emitting diode (OLED) has a structure in which an organic light emitting layer having a functional thin film type is inserted between an anode and a cathode, and generates light by recombining electrons injected from the cathode and holes injected from the anode in the organic light emitting layer.

OLED displays can be divided into a passive matrix (PM) type and an active matrix (AM) type according to a driving method thereof. In a PM type OLED display, anodes and cathodes are simply respectively arranged in columns and rows. A scanning signal is supplied to the cathode from a row driving circuit and, at this point, only one row is selected from a plurality of rows. Also, in a column driving circuit, data signals are inputted to each of the pixels. An AM type OLED display controls signals inputted to each pixel using a thin film transistor. The AM type OLED display can handle a large amount of signals, and thus is used for a display apparatus for realizing a motion picture.

Presently, in order to realize a top emission AM type OLED display having a low power consumption and a high bright room contrast ratio (CR) characteristic, an RGB independent deposition method has been widely used. In the RGB independent deposition method, patterning for each colors of light must be performed using fine metal masks. However, the RGB independent deposition method can be hardly applied to a large scale substrate due to precision problems in aligning the fine metal masks and mask sagging phenomenon as the size of masks increases. An inkjet method, which is one of the methods for forming other RGB independent light emitting layer, can be used for a large size substrate. However, the characteristics of soluble materials must be secured in advance since, presently, the characteristics of the soluble materials are inferior to those of the deposition materials. In addition, a laser induced thermal imaging (LITI) method has been used, in which a light emitting layer is independently transferred using a laser; however, this method results in a short lifetime of the OLED device.

A white OLED-color filter (WOLED-CF) method used in conjunction with a color filter in a white OLED has received much attention in consideration of processability and yield. A white OLED can be realized by forming a plurality of organic light emitting materials that respectively emit red, green and blue colors in an organic light emitting layer or by forming complementary pairs of organic light emitting materials in an organic light emitting layer. However, in the WOLED-CF method, white light must be filtered through a color filter, and thus the optical transmittance is relatively low when compared to that of the RGB independent deposition method. The WOLED-CF method has an optical transmittance with respect to white light of approximately 25%. When a resonance structure is used in the WOLED-CF method, the optical transmittance in a frontal direction can be increased approximately 30 to 50% when compared to a non-resonance case, and color reproducibility can be enlarged to be greater than 100% when compared to the national television system committee (NTSC) standard. In order to maximize the optical efficiency, an RGBW pixel structure in which a resonance RGB pixel and a non-resonance white pixel which has an optical transmittance of 100% are used can be employed. However, a display having a RGBW pixel structure that uses both the resonance RGB pixel and the non-resonance white pixel has a severe problem in changing a non-primary color due to the difference of brightness change according to the viewing angle with respect to the resonance pixel and the non-resonance pixel and, in particular, the color change according to viewing angle with respect to the white color is large. Therefore, the display can hardly be applied to actual displays.

SUMMARY OF THE INVENTION

To address the above and/or other problems, the present invention provides an organic light emitting display apparatus that has excellent viewing angle characteristics, a low power consumption, and a long lifetime.

According to an aspect of the present invention, an organic light emitting display apparatus comprises: red, green and blue pixels, each of which comprises a semi-transparent electrode, a reflection electrode facing the semi-transparent electrode, and an emissive layer interposed between the semi-transparent electrode and the reflection electrode; a white pixel which comprises a transparent electrode, a reflection electrode facing the transparent electrode, and an emissive layer interposed between the transparent electrode and the reflection electrode; red, green, blue and white color filters disposed to correspond to each of the red, green, blue and white pixels; and an optical path control layer disposed at least between the transparent electrode and the white color filter in the white pixel.

The optical path control layer may have a refraction index difference of within 10% from that of the transparent electrode of the white pixel.

The optical path control layer may have a refractive index between 1.8 and 2.0 in a visible light region.

The optical path control layer may have an optical transmittance of greater than 90% in a visible light region.

The optical path control layer may be formed of a composite material comprising at least one selected from the group consisting of an organic material, an oxide and a sulphide, for example, $Al_2O_3$, $BaO$, $MgO$, $HfO_2$, $ZrO_2$, $CaO_2$, $SrO_2$, $Y_2O_3$, $Si_3N_4$, $AlN$, $GaN$, $ZnS$ and $CdS$.

The optical path control layer may be disposed between the semi-transparent electrode of the red, green and blue pixels and the red, green, blue and white color filters.

The white color filter selectively may absorb a specific wavelength so that the difference of Cx and Cy values of white light required by a panel and that of white light generated from the white pixel is within ±0.03.

The white color filter may have a neutral density (ND) filter function to control intensity of light.

The semi-transparent electrode may comprise a transparent electrode and a semi-transparent film formed under the transparent electrode, the semi-transparent film may be formed of at least one material selected from the group consisting of ITO/Ag/ITO, ITO/Ag/IZO, ATD and ITO/APC/ITO, and the transparent electrode may comprise at least one material selected from the group consisting of ITO, IZO, ZnO and $In_2O_3$.

The optical paths of the red, green and blue pixels may be controlled by controlling the thickness of the transparent electrode.

The emissive layer may be a stacking type or a tandem type.

The emissive layer may comprise a fluorescent material or a phosphor material.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

The present invention will now be described more fully with reference to the accompanying drawings in which exemplary embodiments of the invention are shown. Like reference numerals refer to the like elements in the drawings. In describing the present invention, it is understood that, when detailed descriptions with respect to related well known functions or configurations may seem to unnecessarily make unclear the current invention, the detailed descriptions may be omitted.

In the drawings, the thicknesses of layers and regions are exaggerated for clarity. Also, it will be understood that, when a film, layer, region, or plate is referred to as being "on" another film, layer, region, or plate, the film, layer, region, or plate can be directly on another element or layer or intervening elements or layers.

An OLED display according to an embodiment of the present invention includes at least four pixels of red, green, blue and white (RGBW) colors. Of the RGBW pixels, pixel electrodes of the RGB pixels are formed of a semi-transparent mirror having a resonance characteristic and an electrode of the W pixel is formed of a transparent mirror having a non-resonance characteristic. Also, the OLED display according to an embodiment of the present invention includes an optical path control layer having a refractive index similar to that of the W pixel electrode on a lower part of the W pixel electrode to secure a high viewing angle performance in white color. The OLED display includes a white color filter in the white pixel to selectively transmit a spectrum emitted from the white light emitting layer. Thus, the OLED display can control a color emitted from a white light emitting layer to form a white color of the display panel, and ensures a high viewing angle performance.

Figure 1:
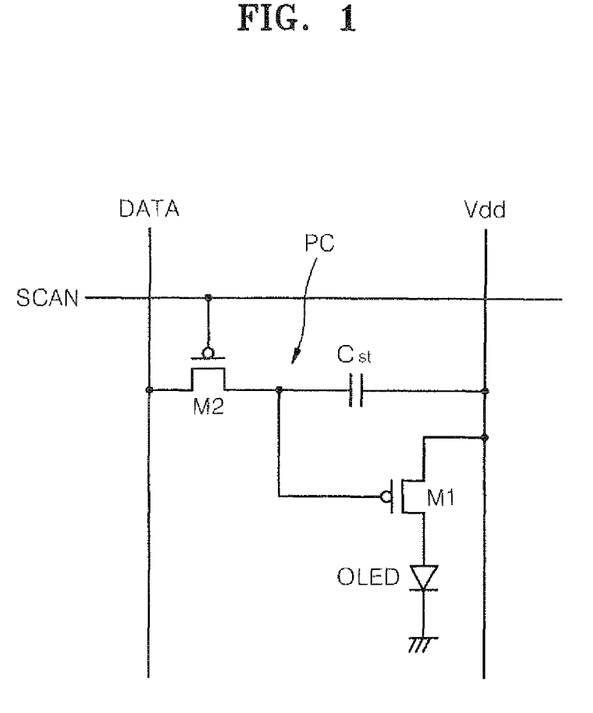
FIG. 1 is a pixel circuit of a unit pixel of an active matrix type organic light emitting display apparatus according to an embodiment of the present invention.

FIG. 1 is a pixel circuit of a unit pixel of an active matrix (AM) type organic light emitting display apparatus according to an embodiment of the present invention.

Referring to FIG. 1, the AM type organic light emitting display apparatus is connected to a plurality of signal lines, and includes a plurality of RGB pixels arranged approximately in a matrix. Each of the RGB pixels has a pixel circuit PC.

Each pixel includes a data line DATA, a scan line SCAN, and a Vdd power source line Vdd that is a driving power of an organic light emitting diode (OLED). The pixel circuit PC is electrically connected to the data line DATA, the scan line SCAN, and the Vdd power source line Vdd, and controls the light emission of the OLED.

Each pixel includes at least two thin film transistors (TFTs), such as a switching TFT M2 and a driving TFT M1, a storage capacitor unit Cst, and an organic light emitting diode OLED.

The switching TFT M2 is turned on and off by a scan signal applied to the scan line SCAN and transmits a data signal applied to the data line DATA to the capacitor unit Cst and the driving TFT M1. A switching device according to the present invention is not limited to the switching TFT M2 of FIG. 1, may be a switching circuit having a plurality of TFTs and capacitors, or may further include a circuit that compensates a Vth value of the driving TFT M1 or a circuit that compensates for a voltage drop of the Vdd power source line Vdd.

The driving TFT M1 determines the amount of current input to the organic light emitting diode in response to a data signal transmitted through the switching TFT M2.

The capacitor unit Cst stores the data signal transmitted from the switching TFT M2 for one frame period.

In the circuit diagram of FIG. 1, the driving TFT M1 and the switching TFT M2 are depicted as PMOS TFTs; however, the present invention is not limited thereto. That is, at least one of the driving TFT M1 and the switching TFT M2 can be an NMOS TFT. Also, the number of TFTs and capacitors is not limited to that shown in FIG. 1, and can be increased as necessary.

Figure 2:
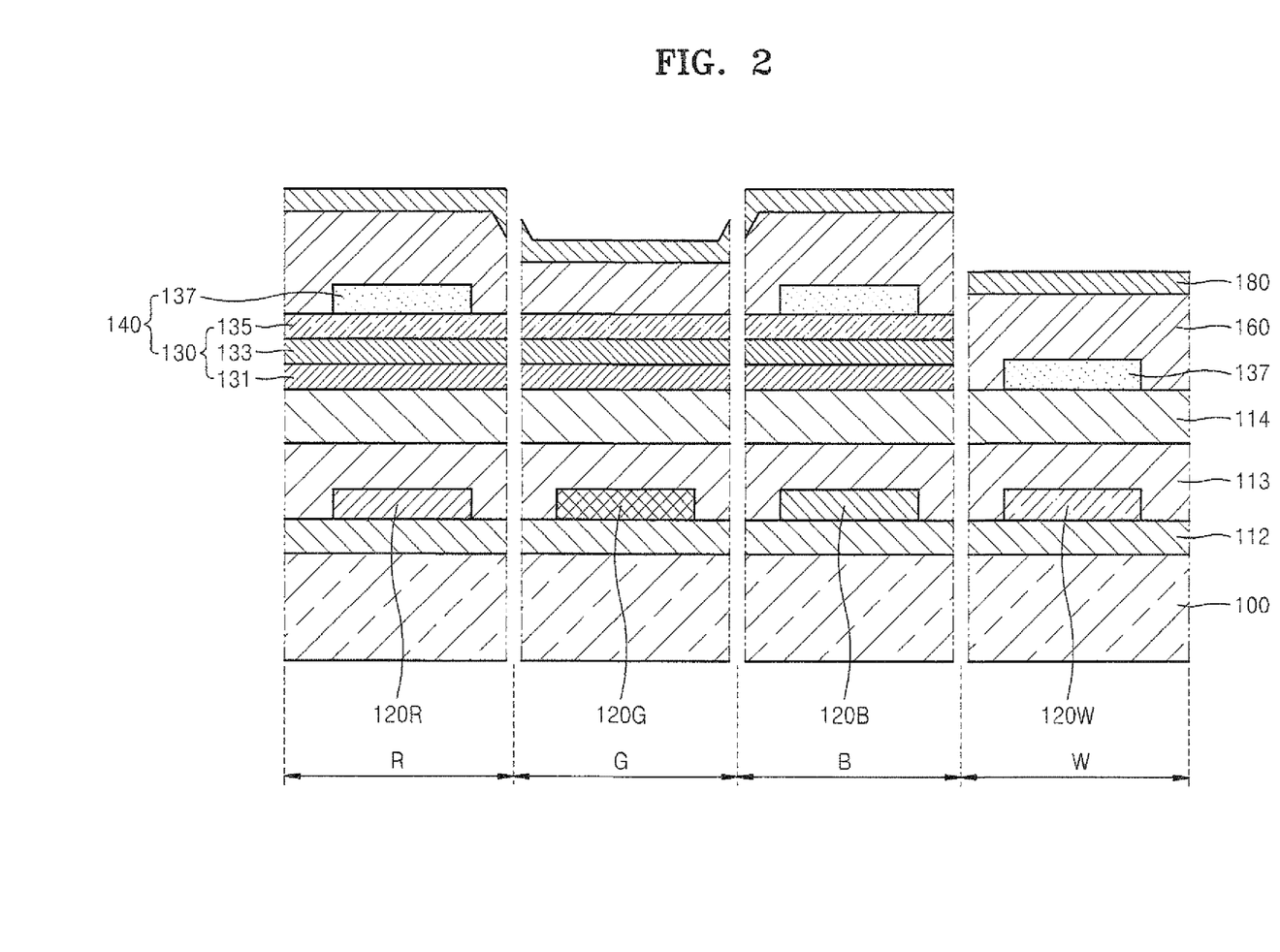
FIG. 2 is a schematic cross-sectional view of four neighboring pixels (R, G, B and W) in an organic light emitting display apparatus that realizes the pixel circuit of FIG. 1 according to an embodiment of the present invention.
Figure 3:
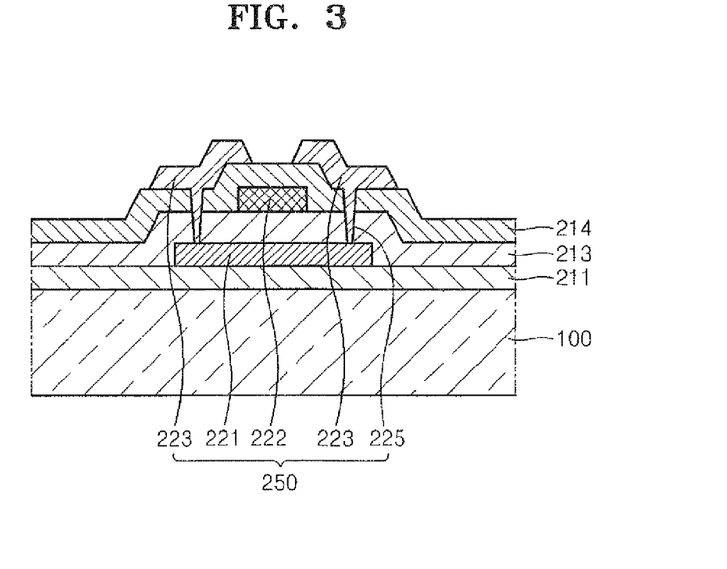
FIG. 3 is a schematic cross-sectional view of a driving circuit of the organic light emitting display apparatus of FIG. 2 according to an embodiment of the present invention.

FIG. 2 is a schematic cross-sectional view of four neighboring pixels (R, G, B and W) in an organic light emitting display apparatus that realizes the pixel circuit of FIG. 1 according to an embodiment of the present invention, while FIG. 3 is a schematic cross-sectional view of a driving circuit of the organic light emitting display apparatus of FIG. 2 according to an embodiment of the present invention.

The four pixels of a red pixel R, a green pixel G, a blue pixel B and a white pixel W may be repeated along columns and/or rows, and the disposition of the pixels can be configured in various ways.

Referring to FIG. 2, the OLED display according to the present invention includes a red pixel R, a green pixel G, a blue pixel B and a white pixel W formed on a substrate 100. The OLED display also includes color filters, such as red color filter 120R, green color filter 120G, blue color filter 120B and white color filter 120W, that selectively absorb white light emitted from each of the pixels corresponding to each of the pixels, and includes an optical path control layer 114 between the color filters and each of the pixels.

The substrate 100 may be a transparent substrate, that is, a glass substrate containing $SiO_2$ as a main component. However, the substrate 100 is not limited thereto, and may be a plastic substrate or a metal substrate.

As shown in FIG. 3, a driving TFT 250 may be included on an upper surface of the substrate 100. In the current embodiment, a top gate type TFT is depicted as an example. However, a TFT having a different structure can also be included.

Before the TFT 250 is formed, an insulating layer 211, such as a barrier layer and/or a buffer layer for preventing the diffusion of impurity ions, preventing the penetration of moisture or external air, or planarizing of a surface, can be formed on the upper surface of the substrate 100. The insulating layer 211 may be formed of $SiO_2$ and/or SiNx.

An active layer 221 of TFT is formed on the insulating layer 211 using a semiconductor material, and a gate insulating film 213 is formed to cover the active layer 221. The active layer 221 may be formed of an inorganic semiconductor material such as amorphous silicon or polysilicon, or an organic semiconductor material. The active layer 221 includes a source region, a drain region, and a channel region between the source region and the drain region.

The active layer 221 may be formed of polysilicon and, in this case, a predetermined region may be doped with a dopant. Of course, the active layer 221 may be formed of amorphous silicon instead of polysilicon, and may be formed of various organic semiconductor materials such as pentacene.

The gate insulating film 213 is formed to insulate the active layer 221 from a gate electrode 222. The gate insulating film 213 may be formed of an insulating material such as silicon oxide or silicon nitride, and also can be formed of insulating organic materials besides the above materials.

The gate electrode 222 is formed on the gate insulating film 213, and an interlayer insulating film 214 is formed to cover the gate electrode 222. Source and drain electrodes 223 formed on the interlayer insulating film 214 are connected to the active layer 221 through contact holes 225.

The gate electrode 222 may be formed of various conductive materials, for example, Mg, Al, Ni, Cr, Mo, W, MoW or Au. In this case, the gate electrode 222 can be formed in various forms such as a single layer or multiple layers.

The interlayer insulating film 214 may be formed of an insulating material such as silicon oxide or silicon nitride, and also can be formed of insulating organic materials besides the above materials. The contact hole 225, through which source and drain regions are exposed, can be formed by selectively removing the interlayer insulating film 214 and the gate insulating film 213. The source and drain electrodes 223 are formed on the interlayer insulating film 214 to fill the contact holes 225 in a single layer or multiple layers using the materials used to form the gate electrode 222 described above.

The source and drain electrodes 223 of the TFT 250 are electrically connected to a lower electrode of the pixel.

The TFTs formed in this way are covered and protected by a passivation layer 112. The passivation layer 112 may be an inorganic insulating film and/or an organic insulating film. When the passivation layer 112 is an inorganic insulating film, the passivation layer 112 may be formed of a material including $SiO_2$, SiNx, SiON, $Al_2O_3$, $TiO_2$, $Ta_2O_5$, $HfO_2$, $ZrO_2$, BST or PZT. When the passivation layer 112 is an organic insulating film, the passivation layer 112 may be formed of a material including poly methylmethacrylate (PMMA), polystyrene (PS), a polymer derivative having a phenol group, acryl group polymer, imide group polymer, arylether group polymer, amaid group polymer, fluorine group polymer, p-gilyrene group polymer, vinyl alcohol group polymer, and a blend of these materials. The passivation layer 112 may be formed as a composite stack layer of inorganic insulating films and organic insulating films.

The red color filter 120R corresponding to the red pixel R, the green color filter 120G corresponding to the green pixel G, the blue color filter 120B corresponding to the blue pixel B, and the white color filter 120W corresponding to the white pixel W, are formed on the passivation layer 112.

The red color filter 120R, the green color filter 120G, the blue color filter 120B, and the white color filter 120W may be disposed by a color filter array (COA) method, and generate light of colors different from each other by receiving white light from each of the pixels.

The white color filter 120W selectively absorbs light of a specific wavelength region by receiving white light from the white pixel W to meet the white color characteristic of the panel. When white color is displayed on the panel by simultaneously emitting light from the resonance red/green/blue pixels and the non-resonance white pixel, the color change of white color is great according to the viewing angle. Therefore, the white color filter 120W that selectively absorbs and transmits light is included in the white pixel W to make color close to the white color characteristic of panel. Preferably, the white color filter 120W is selectively used so that the difference of Cx and Cy values of white light generated from the white pixel W and that of white light that is required by the panel can be within ±0.03.

Figure 4:
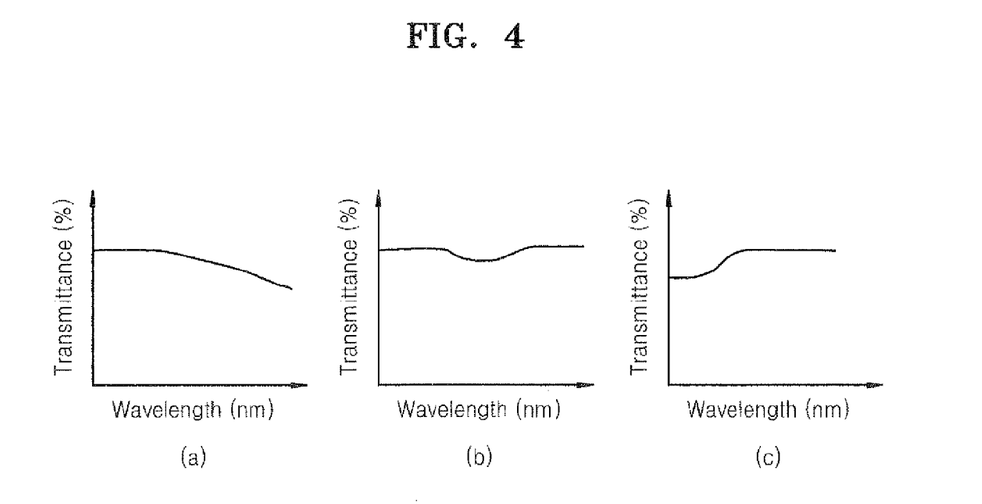
FIG. 4 shows graphs of transmittance of various white filters according to an embodiment of the present invention.

FIG. 4 shows graphs of transmittance of various white color filters according to an embodiment of the present invention.

When the white color characteristic of white light generated from a light source is different from the white color characteristic of panel, an appropriate white color filter that can compensate for the difference of white color characteristic can be used. Graph (a) of FIG. 4 is an absorption result of a white color filter that absorbs red light, graph (b) of FIG. 4 is that of a white color filter that absorbs green light, and graph (c) of FIG. 4 is that of a white color filter that absorbs blue light. The white color filter 120W of FIG. 2 according to the present invention is not limited to the examples of FIG. 4, and can be various filters that can selectively absorb specific light according to the color characteristic of light generated from a light source.

Also, the white color filter 120W can increase bright room contrast ratio (CR) characteristic by adding a neutral density (ND) filter function that can control the intensity of light.

The OLED display of FIG. 2 may include an over-coating layer 113 on the color filters 120R, 120G, 120B and 120W to protect the color filters 120R, 120G, 120B and 120W and to planarize the layer on which the color filters 120R, 120G, 120B and 120W are formed. The over-coating layer 113 may be an inorganic insulating film and/or an organic insulating film. When the over-coating layer 113 is an inorganic insulating film, the over-coating layer 113 may be formed of a material including $SiO_2$, SiNx, SiON, $Al_2O_3$, $TiO_2$, $Ta_2O_5$, $HfO_2$, $ZrO_2$, BST or PZT. When the over-coating layer 113 is an organic insulating film, the over-coating layer 113 may be formed of a material including poly methylmethacrylate (PMMA), polystyrene (PS), a polymer derivative having a phenol group, acryl group polymer, imide group polymer, arylether group polymer, amaid group polymer, fluorine group polymer, p-gilyrene group polymer, vinyl alcohol group polymer, and a blend of these materials. The over-coating layer 113 may be formed in a composite stack layer of inorganic insulating films and organic insulating films.

The over-coating layer 113 may have a refractive index between 1.5 and 2.6.

The optical path control layer 114 is formed on the over-coating layer 113. When the resonance red/green/blue pixels and the non-resonance white pixel are simultaneously emitting light, the color change of white color is great according to the viewing angle. Therefore, in order to overcome the color change of white color, the optical path control layer 114 is used.

The optical path control layer 114 may have a high optical transmittance so as to minimize optical loss in the optical path control layer 114. The optical path control layer 114 may be formed of a combination of at least one selected from the group consisting of an organic material, an oxide, and a sulphide, for example, $Al_2O_3$, BaO, MgO, $HfO_2$, $ZrO_2$, $CaO_2$, $SrO_2$, $Y_2O_3$, $Si_3N_4$, AlN, GaN, ZnS and CdS. The optical path control layer 114 may have an optical transmittance of approximately greater than 90% in the visible light region.

The optical path control layer 114 may have a refraction index similar to that of the transparent electrode 137, or be different by approximately 10% from that of the transparent electrode 137. The optical path control layer 114 may have a refraction index between 1.8 and 2.0 in the visible light region in consideration of the refraction index of the transparent electrode 137.

The optical path control layer 114 may be formed to have a thickness of approximately below 10,000 Å.

In the case of the white pixel W, although not shown, an auxiliary layer for increasing an optical extraction efficiency may be additionally formed on or under the optical path control layer 114. The auxiliary layer may be a low refractive index layer or a high refractive index layer, in which a low refractive index array (LIA) pattern or a high refractive index array (HIA) pattern is formed using a low refractive index material or a high refractive index material, or may include both the low refractive index layer and the high refractive index layer. The low refractive index material may have a refractive index between 1 and 1.55, and the high refractive index material may have a refractive index between 1.9 and 2.8.

A red pixel R, a green pixel G, a blue pixel B and a white pixel W corresponding to red color filter 120R, green color filter 120G, blue color filter 120B and white color filter 120W, respectively, are formed on the optical path control layer 114.

Each of the red pixel R, the green pixel G, the blue pixel B, and the white pixel W has a resonance structure that includes a semi-transparent electrode 140 including a semi-transparent film 130 and a transparent electrode 137, an organic layer 160 that includes a light emitting layer, and a reflection electrode 180.

The semi-transparent film 130 is formed on the optical path control layer 114, has a multi-layer structure of a metal layer and conductive oxide films on and under the metal layer, and may be formed of at least one selected from the group consisting of ITO/Ag/ITO, ITO/Ag/IZO (Indium Zinc Oxide), ATD (ITO/Ag alloy/ITO), ITO/APC (Ag—Pd—Cu alloy)/ITO, and a material equivalent to these materials.

The transparent electrode 137 is formed of a transparent conductive material such as ITO, IZO, ZnO or $In_2O_3$ on the semi-transparent film 130, and may be formed in a predetermined pattern for each pixel by using a photolithography method.

The semi-transparent electrode 140 may be electrically connected to a TFT thereunder. The semi-transparent electrode 140 can function as an anode by being connected to an external electrode terminal (not shown).

The reflection electrode 180 is formed on the organic layer 160 corresponding to the semi-transparent electrode 140. The reflection electrode 180 may be of a common type in which reflection electrodes of each of the pixels are connected in common since the reflection electrode 180 is formed on the entire surfaces of the pixels by depositing a reflective conductive material such as Li, Ca, LiF/Ca, LiF/Al, Al, Ag, Mg, Ba, or a compound of these materials. The reflection electrode 180 may function as a cathode by being connected to an external electrode terminal (not shown).

The polarities of the semi-transparent electrode 140 and the reflection electrode 180 may be reversed.

The organic layer 160 interposed between the semi-transparent electrode 140 and the reflection electrode 180 may be formed by stacking an emissive layer and at least one functional layer selected from a hole transport layer, a hole injection layer, an electron transport layer, and an electron injection layer in a single or composite structure.

The organic layer 160 may be formed of a low molecular weight or a polymer organic material. The low molecular weight organic material may be copper phthalocyanine (CuPc), N,N'-Di(naphthalene-1-yl)-N,N'-diphenyl-benzidine (NPB), and tris-8-hydroxyquinoline aluminum (Alq3). The polymer organic material used to form the polymer organic layer may be poly-(2,4)-ethylene-dihydroxy thiophene (PEDOT) or polyaniline (PANI) using an inkjet printing method or a spin coating method. The polymer organic emissive layer can be formed of poly-phenylenevinylene (PPV), soluble PPV's, syano-PPV, or polyfluorene.

The emissive layer may be of a stacking type or a tandem type. The stacking type emissive layer can include red, green and blue sub-emissive layers, and the stacking order of the sub-emissive layers are not specifically limited. In the stacking type emissive layer, the red, green, and blue-sub emissive layers may be fluorescent emissive layers or at least one of the sub-emissive layers may be a phosphorescence layer. In the tandem type emissive layer, the red, green, and blue sub-emissive layers may be fluorescent emissive layers or at least one of the sub-emissive layers may be a phosphorescence layer. Also, in the tandem type emissive layer, each of the emissive layers stacked on both side of a charge generation layer (CGL) can emit white color, colors different from each other, or the same color, and, at this point, the colors different from each other or the same color may be a single color or multiple colors.

The structures of the sub-emissive layers of each of the pixels may be different from each other. If the sub-emissive layers have a combination to generate white light, the sub-emissive layers can be arranged in any combination to generate various color lights besides red, green and blue lights.

Resonance occurs between the reflection electrode 180 and the semi-transparent electrode 140 when a portion of light generated from the light emission region is reflected by the semi-transparent film 130. It is necessary to control the optical distance between the reflection electrode 180 and the semi-transparent electrode 140 so that each of the pixels can realize maximum optical efficiency by preventing a spectrum of white light emitted by the resonance from being biased to a specific wavelength region. For this purpose, the transparent electrode 137 is on the semi-transparent film 130, and the optical distance between the reflection electrode 180 and the semi-transparent electrode 140 can be controlled by controlling the thickness of the transparent electrode 137. The dielectric films have a refractive index similar to the transparent electrode 137 and do not adsorb lights in the visible light region. As another example, the optical distance between the reflection electrode 180 and the semi-transparent electrode 140 can be controlled by controlling the thickness of dielectric films inserted and formed on and/or under the transparent electrode 137 after the transparent electrode 137 in each of the pixels is formed to have the same thickness. As another example, the optical distance between the reflection electrode 180 and the semi-transparent electrode 140 can be controlled by controlling the thickness of the functional layer. FIG. 2 depicts an example of controlling the optical distance in each of the pixels by removing the transparent electrode 137 of the green pixels G and by forming the optical distance of the red pixel R and the blue pixel B to be the same. However, the present invention is not limited thereto, that is, the optical distance in each of the pixels can be controlled by changing the thicknesses of the transparent electrode 137, the dielectric film, or the functional layer, respectively, according to the resonance characteristics.

The white pixel W has a non-resonance structure comprising the transparent electrode 137, the organic layer 160 that includes an emissive layer, and the reflection electrode 180.

The transparent electrode 137 may be formed of a transparent conductive material such as ITO, IZO, ZnO or $In_2O_3$ on the optical path control layer 114, and may be formed to be a predetermined pattern in each pixel using a photolithography method. The transparent electrode 137 may be electrically connected to a TFT. The transparent electrode 137 can function as an anode by being connected to an external electrode terminal (not shown).

The reflection electrode 180 is formed on the organic layer 160 corresponding to the transparent electrode 137. The reflection electrode 180 may be a common type electrode in which the reflection electrodes of each of the pixels are connected in common since the reflection electrode 180 is formed on the entire surfaces of the pixels by depositing a reflective conductive material such as Li, Ca, LiF/Ca, LiF/Al, Al, Ag, Mg, Ba, or a compound of these materials. The reflection electrode 180 may function as a cathode by being connected to an external electrode terminal (not shown).

The polarities of the transparent electrode 137 and the reflection electrode 180 may be reversed.

The organic layer 160 interposed between the transparent electrode 137 and the reflection electrode 180 and the emissive layer included in the organic layer 160 are identical to the organic layer 160 and the emissive layer of the red pixel R, the green pixel G and the blue pixel B, and thus the detailed descriptions thereof will not be repeated.

Figure 5:
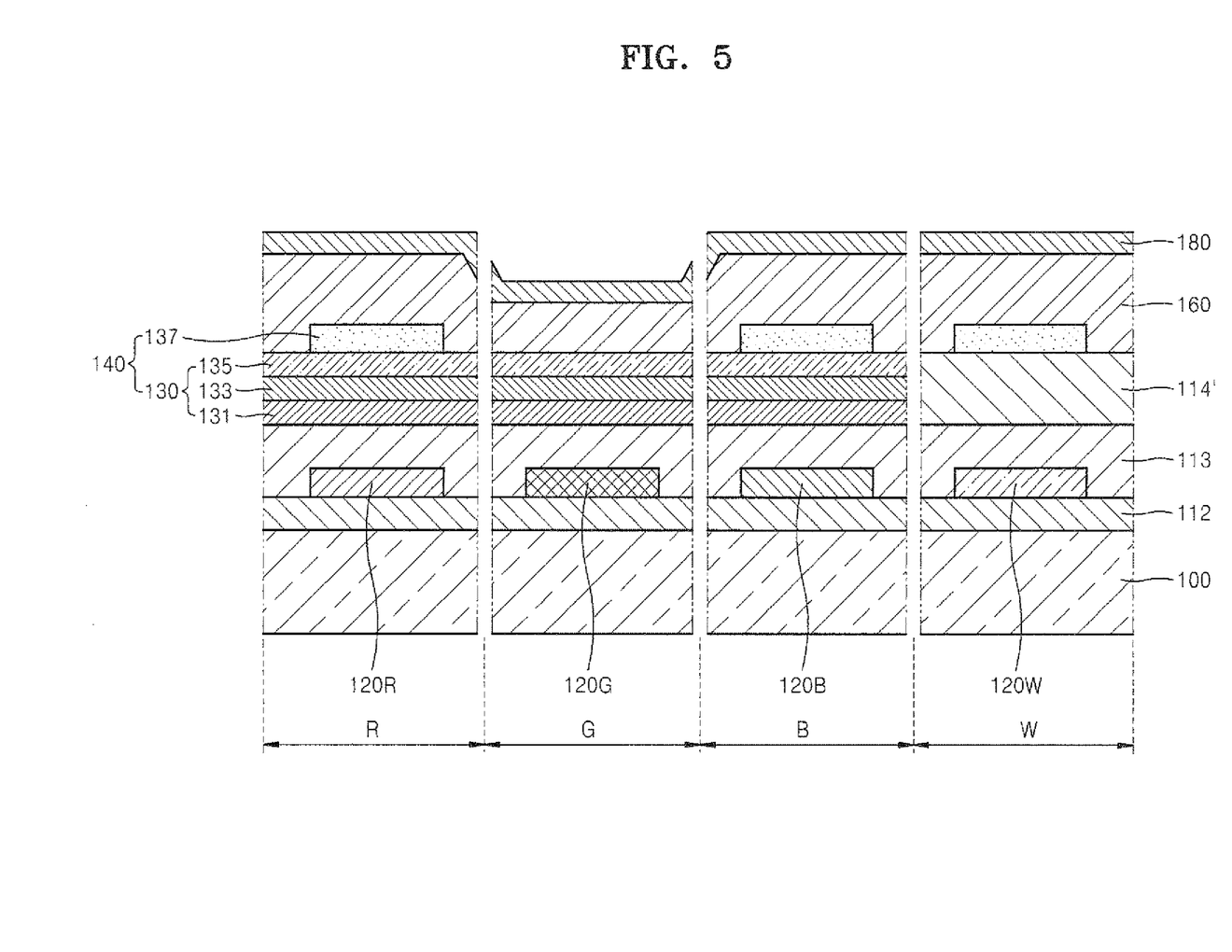
FIG. 5 is a schematic cross-sectional view of four neighboring pixels (R, G, B and W) in an organic light emitting display apparatus that realizes the pixel circuit of FIG. 1 according to another embodiment of the present invention.

FIG. 5 is a schematic cross-sectional view of neighboring four pixels (R, G, B and W) in an organic light emitting display apparatus that realizes the pixel circuit of FIG. 1 according to another embodiment of the present invention.

The organic light emitting display apparatus of FIG. 5 is identical to the organic light emitting display apparatus of FIG. 2 except that an optical path control layer 114' is formed in the white pixel W, and thus the detailed descriptions of identical configurations will not be repeated.

Referring to FIG. 5, the optical path control layer 114' is formed only under the white pixel W, and thus minimizes the color change according to the viewing angle in the white pixel W. The optical path control layer 114' may be formed only in the white pixel W by removing optical path control layers in the red pixel R, the green pixel G and the blue pixel B after the optical path control layer 114' is deposited on the entire surface of the substrate 100, including the red pixel R, the green pixel G, the blue pixel B and the white pixel W. The optical path control layer 114' can also be only formed in the white pixel W by using a mask.

The organic light emitting display apparatus of FIGS. 2 and 5 according to the embodiments of the present invention are a bottom emission type in which light is emitted through the substrate 100. However, the present invention is not limited thereto, and can be applied to a top emission type organic light emitting display apparatus. In this case, the lower electrode of each of the pixels may be formed in a reflection electrode, the upper electrode may be formed in a transparent electrode or a semi-transparent electrode, the optical path control layer may be formed on the transparent electrode or the semi-transparent electrode. Color filters corresponding to each of the pixels may be formed in a stacking type on the transparent electrode or on an additional substrate.

Figure 6A:
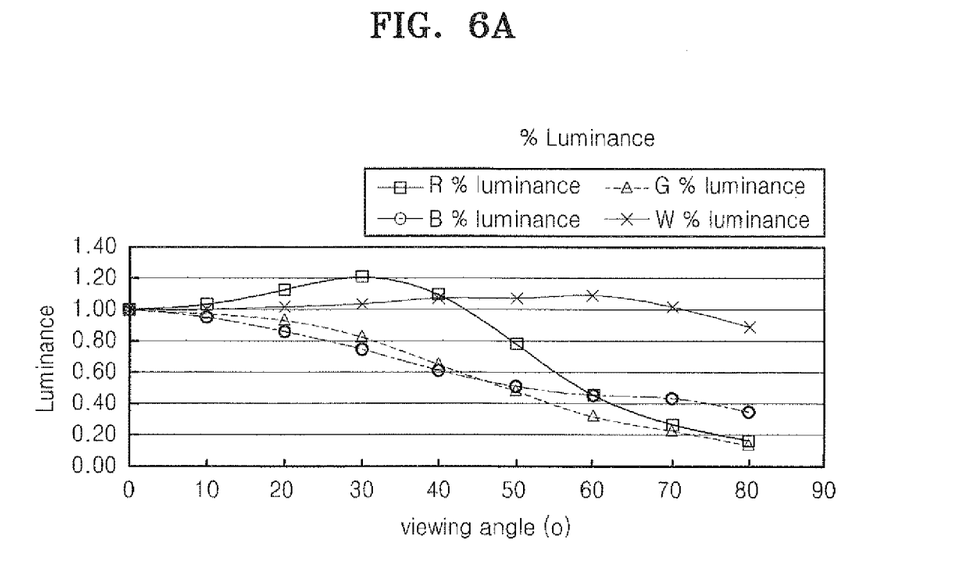
FIGS. 6A and 6B are graphs respectively showing brightness change and color change of primary color according to viewing angle in an OLED display having a conventional structure of resonance RGB pixels and non-resonance white pixel.
Figure 6B:
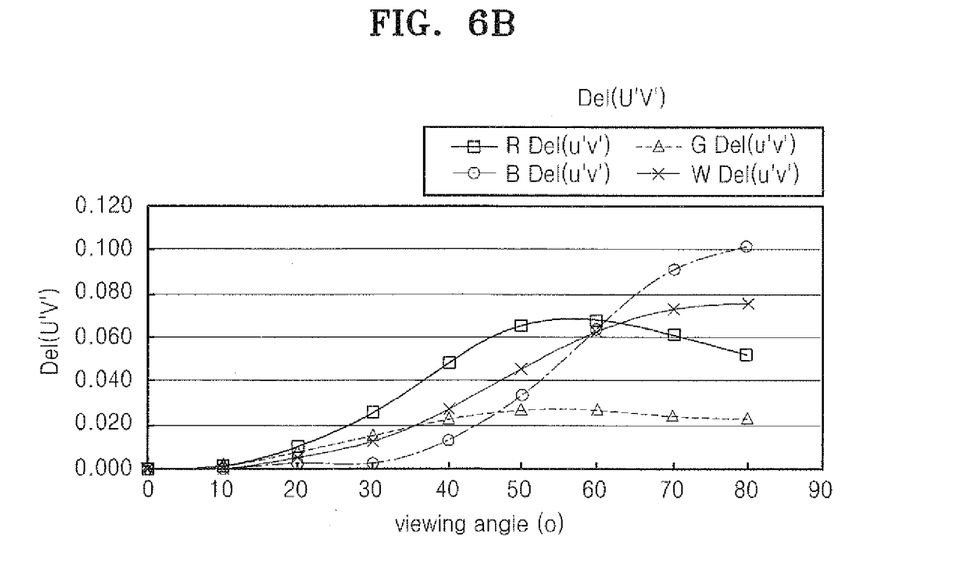

FIGS. 6A and 6B are graphs showing brightness change and color change, respectively, of a primary color according to a viewing angle in an OLED display having a conventional structure of resonance RGB pixels and non-resonance white pixel.

Referring to FIG. 6A, white color shows little brightness change according to the viewing angle; however, red, green and blue colors show a large brightness change according to viewing angle. In particular, at a viewing angle of 60 degrees, the brightness has a value of approximately 40% when compared to that of the viewing angle of 0 degree. Referring to FIG. 6B, the color change of white color according to the viewing angle is large.

Figure 7A:
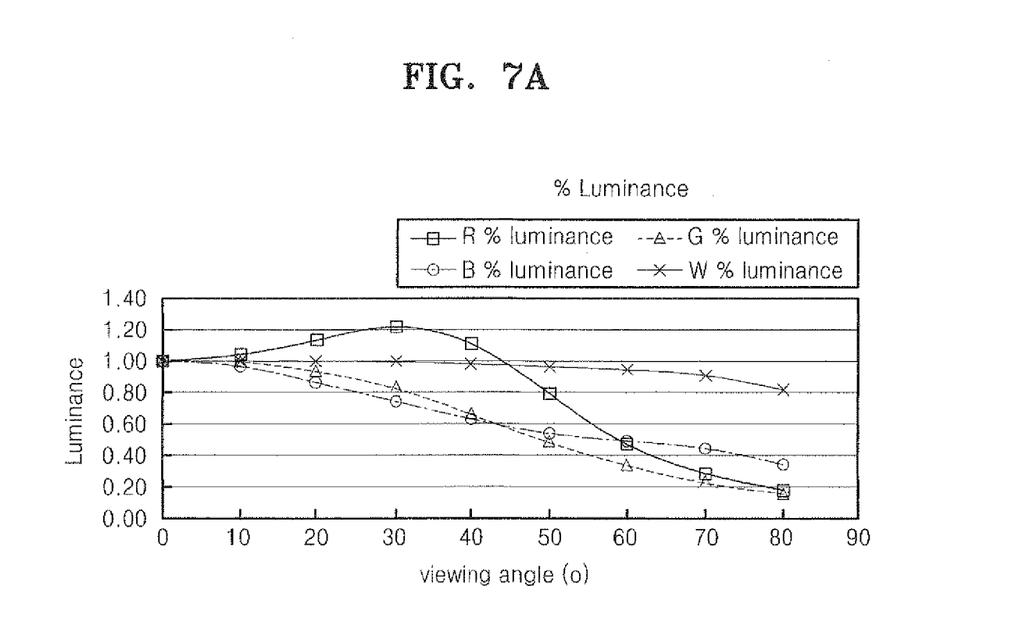
FIGS. 7A and 7B are graphs respectively showing brightness change and color change of primary color according to a viewing angle in an OLED display having a structure of resonance RGB pixels and non-resonance white pixel that includes an optical path control layer according to an embodiment of the present invention.
Figure 7B:
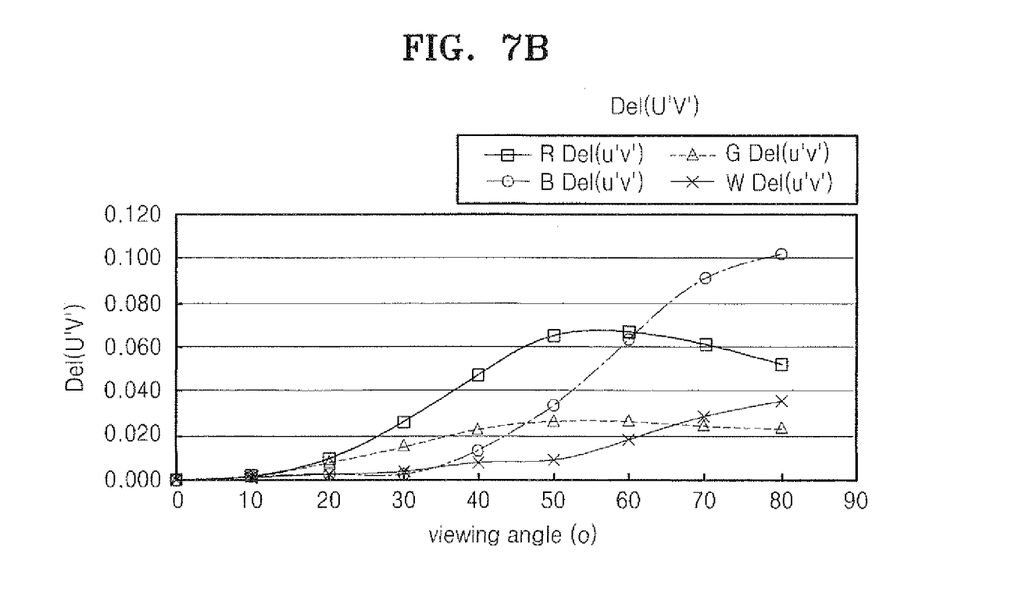

FIGS. 7A and 7B are graphs showing brightness change and color change, respectively, of a primary color according to a viewing angle in an OLED display having a structure of resonance RGB pixels and non-resonance white pixel that includes an optical path control layer according to an embodiment of the present invention. In the current embodiment, an optical path control layer (OPCL) that is formed of SiNx and has a thickness of 4,000 Å is inserted in the non-resonance white pixel W.

Referring to FIGS. 7A and 7B, the brightness change according to viewing angle maintains the characteristics of resonance pixels and non-resonance pixel; however, the color change of white color is remarkably reduced.

Table 1 summarizes the comparisons of color reproducibility and power consumption between an OLED display having an OPCL according to an embodiment of the present invention and comparative examples.

In Table 1, an OLED display having a structure of resonance red/green/blue pixels and a non-resonance white pixel that each include an OPCL is used in an embodiment of the present invention, an OLED display having a structure of resonance red/green/blue pixels that use identical white emissive layer is used in the comparative example 1, an OLED display having a structure of non-resonance red/green/blue pixels and a non-resonance white pixel is used in the comparative example 2, and an OLED display in which red and green phosphors and a blue fluorescent are applied to a red/green/blue emissive layers deposited using an independent deposition structure method is used in the comparative example 3. Each of the OLED displays meets the same panel requirements (40 inch Full HD, Full white brightness 300 nit, Peak white brightness 600 nit).

TABLE 1

| | Embodiment | Comparative Example 1 | Comparative Example 2 | Comparative Example 3 |
|---|---|---|---|---|
| Power Consumption (W) | 77.1 | 129.9 | 85.6 | 80.8 |
| Color Reproducibility (1931%) | 100 | 100 | 85 | 103 |
| Color Reproducibility (1976%) | 113 | 113 | 97 | 113 |

Referring to Table 1, the OLED display in which the white pixel W includes an OPCL according to an embodiment of the present invention shows superior in power consumption and color reproducibility to the OLED displays of the comparative examples.

While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:

1. An organic light emitting display apparatus, comprising:
red, green and blue pixels which each comprise a semi-transparent electrode, a reflection electrode facing the semi-transparent electrode, and an emissive layer interposed between the semi-transparent electrode and the reflection electrode;
a white pixel which comprises a transparent electrode, a reflection electrode facing the transparent electrode, and an emissive layer interposed between the transparent electrode and the reflection electrode;
red, green, blue and white color filters disposed in correspondence to each of the red, green, blue and white pixels; and
an optical path control layer disposed at least between the transparent electrode and the white color filter in the white pixel.

2. The organic light emitting display apparatus of claim 1, wherein the optical path control layer has a refraction index difference of within 10% relative to that of the transparent electrode of the white pixel.

3. The organic light emitting display apparatus of claim 1, wherein the optical path control layer has a refractive index in a range of 1.8 and 2.0 in a visible light region.

4. The organic light emitting display apparatus of claim 1, wherein the optical path control layer has an optical transmittance of greater than 90% in a visible light region.

5. The organic light emitting display apparatus of claim 1, wherein the optical path control layer is formed of at least one material combination selected from the group consisting of an organic material, an oxide and a sulphide.

6. The organic light emitting display apparatus of claim 5, wherein the optical path control layer is formed of at least one material combination selected from the group consisting of $Al_2O_3$, BaO, MgO, $HfO_2$, $ZrO_2$, $CaO_2$, $SrO_2$, $Y_2O_3$, $Si_3N_4$, AlN, GaN, ZnS and CdS.

7. The organic light emitting display apparatus of claim 1, wherein the optical path control layer is disposed between the semi-transparent electrode of the red, green and blue pixels and the red, green and blue color filters.

8. The organic light emitting display apparatus of claim 1, wherein the white color filter selectively absorbs a specific wavelength.

9. The organic light emitting display apparatus of claim 8, wherein the white color filter selectively absorbs a specific wavelength so that the difference of Cx and Cy values of white light required by a panel and that of white light generated from the white pixel is within ±0.03.

10. The organic light emitting display apparatus of claim 8, wherein the white color filter includes means for performing a neutral density (ND) filter function so as to control an intensity of light.

11. The organic light emitting display apparatus of claim 1, wherein the semi-transparent electrode comprises a transparent electrode and a semi-transparent film formed under the transparent electrode.

12. The organic light emitting display apparatus of claim 11, wherein the semi-transparent film is formed of at least one material selected from the group consisting of ITO/Ag/ITO, ITO/Ag/IZO, ATD and ITO/APC/ITO.

13. The organic light emitting display apparatus of claim 11, wherein optical distances between the semi-transparent electrode and the reflection electrode of each of the red, green and blue pixels are controlled by controlling a thickness of the transparent electrode.

14. The organic light emitting display apparatus of claim 11, wherein the transparent electrode is of at least one material selected from the group consisting of ITO, IZO, ZnO and $In_2O_3$.

15. The organic light emitting display apparatus of claim 1, wherein the transparent electrode is formed of at least one material selected from the group consisting of ITO, IZO, ZnO and $In_2O_3$.

16. The organic light emitting display apparatus of claim 1, wherein the emissive layer comprises one of a stacking type and a tandem type.

17. The organic light emitting display apparatus of claim 1, wherein the emissive layer comprises one of a fluorescent material and a phosphor material.

18. The organic light emitting display apparatus of claim 1, wherein the organic light emitting display apparatus is of a bottom emission type.

19. The organic light emitting display apparatus of claim 1, wherein the organic light emitting display apparatus is of a top emission type.

* * * * *